Figure 1:
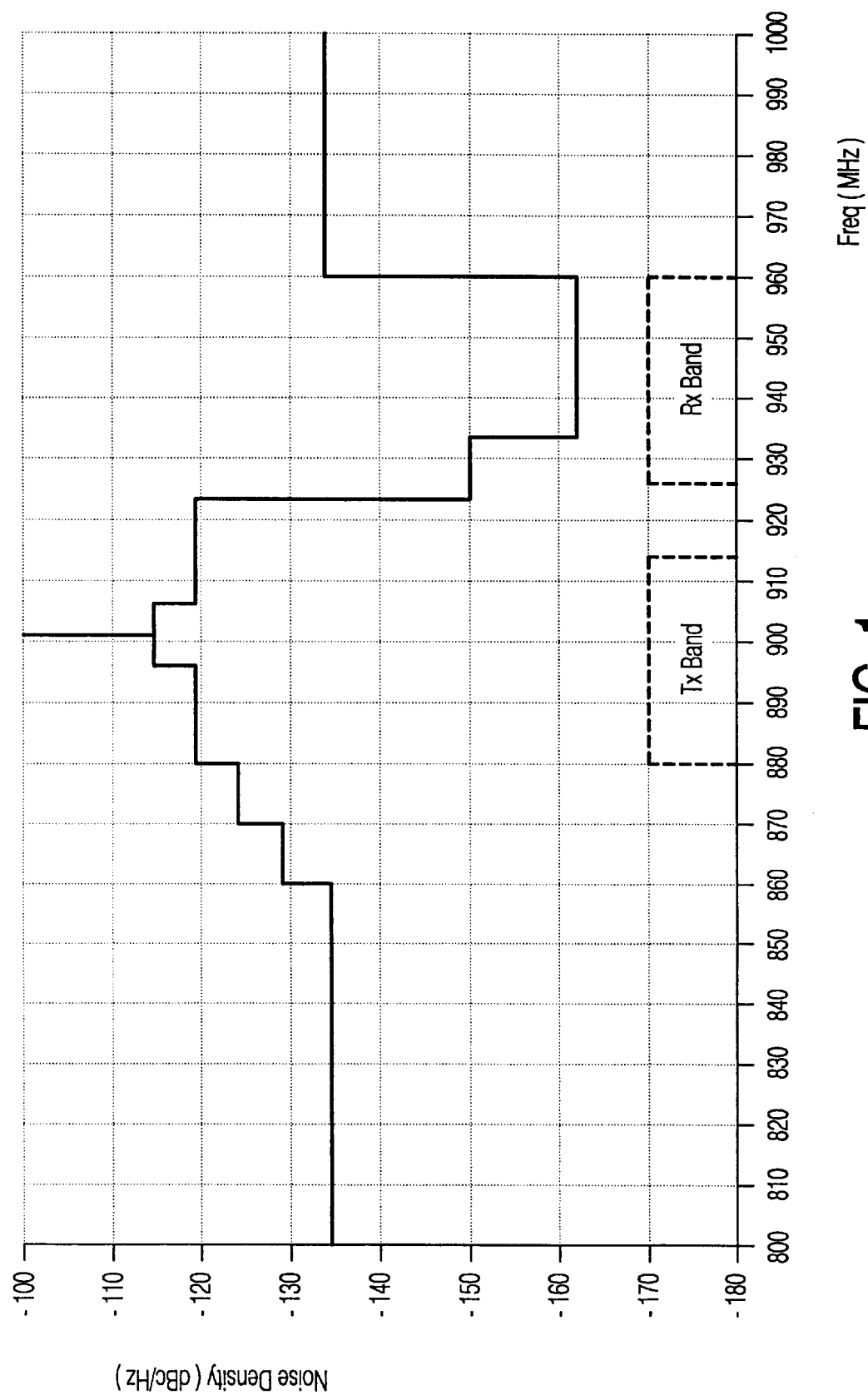

United States Patent

Wagner et al.

[11] Patent Number: 6,133,804
[45] Date of Patent: Oct. 17, 2000

[54] TRANSMITTER WITH COMPLEX PHASE COMPARATOR

[75] Inventors: Elmar Wagner, Nürnberg, Germany; Brian J. Minnis, Crawley, United Kingdom

[73] Assignee: U.S. Philips Corporation, New York, N.Y.

[21] Appl. No.: 09/207,529

[22] Filed: Dec. 8, 1998

[30] Foreign Application Priority Data

Dec. 9, 1997 [GB] United Kingdom .................. 9726047
Jul. 24, 1998 [EP] European Pat. Off. .............. 98305909

[51] Int. Cl.[7] .............................. H03C 3/00; H04B 1/00
[52] U.S. Cl. .......................... 332/127; 332/103; 332/100; 455/260; 375/302; 375/306
[58] Field of Search ............................... 331/12; 332/100, 332/127, 103; 375/302, 305, 306, 308; 455/110, 260

[56] References Cited

U.S. PATENT DOCUMENTS 5,960,364  11/1996  Dent ........................................ 455/552

FOREIGN PATENT DOCUMENTS 4446637A  9/1999  Germany ........................ H04L 27/38
2261345A  5/1993  United Kingdom ............. H04B 1/54

*Primary Examiner*—Arnold Kinkead
*Attorney, Agent, or Firm*—Dicran Halajian

[57] ABSTRACT

A transmitter in which a complex low IF digitised signal is applied in quadrature to a complex phase comparator together with a digitised frequency down-converted version of an analogue signal produced by a transmitter VCO. The low IF digitised signal serves as a reference against which the digitised frequency down-converted version of the transmitter VCO is compared. The output of the complex phase comparator is converted to an analogue signal which is applied as a control signal to the transmitter VCO. An analogue embodiment of the transmitter which uses zero-IF signals is also disclosed.

9 Claims, 3 Drawing Sheets

TRANSMITTER WITH COMPLEX PHASE COMPARATOR

The present invention relates to a transmitter and/or a transmitting section of a transceiver, which section for the convenience of description will be referred to as a transmitter. The transmitter may be used in a cellular telephone operating in accordance with the GSM (Global System for Mobile Communications) standard and for the convenience of description the present invention will be described with reference to the GSM standard.

The GSM standard calls for extremely low levels of spurious emissions from a mobile station transmitter. The specification for spurious emissions is summarised in FIG. 1 of the accompanying drawings, which figure is a graph of frequency in megahertz (MHz) against noise density in dBc/Hz.

The graph indicates the permitted levels of unwanted noise in a 1 Hz bandwidth with respect to a carrier power level of +33 dBm. In the region of the GSM receiver band between 935 MHz and 960 MHz, the noise must be less than −162 dBc and between 925 MHz and 935 MHz must be less than −150 dBc. Noise from wideband VCOs and mixers in a typical transmitter based on up-mixing would exceed these limits at such large offset frequencies and extra filtering must be provided at RF to suppress the noise in the receive band. However, even if the noise is filtered to a sufficiently low level on one side of the carrier, the following power amplifier running heavily into compression removes the AM component of the residual noise and largely restores the unwanted noise sideband. Yet another stage of expensive RF filtering is then required to meet the specification.

An object of the present invention is to simplify the filtering requirements in a transmitter whilst still achieving a required specification for spurious emissions.

According to the present invention there is provided a transmitter comprising a voltage controlled oscillator (VCO) generating an output RF signal and means for applying a modulating data signal, a phase error signal and a frequency demand signal to the VCO.

In an embodiment of the present invention a complex phase comparator compares the actual modulating data signal with a reference signal and the result is used to provide the phase error signal to the VCO.

Although the input signals to the complex phase comparator may be at a zero IF, it is preferable for these signals to be at a low IF which for a GSM transmitter may be of the order of 200 kHz. An advantage of using a low IF over and above zero IF is that ac coupling can be used in the feedback path from the VCO to the complex phase comparator thereby alleviating the undesirable effect of second order intermodulation products generated in the mixers. As well as allowing ac coupling in the complex phase comparator loop, a non-zero IF reduces the risk of pulling of a local oscillator by the VCO generating the output RF signal, which local oscillator generates a frequency corresponding to the local oscillator frequency plus or minus the IF.

If desired the complex signals compared in the phase comparator may be represented in digital form. When implementing the transmitter all of the filters are integratable thereby enabling the transmitter circuit to be fabricated as an integrated circuit.

Figure 2:
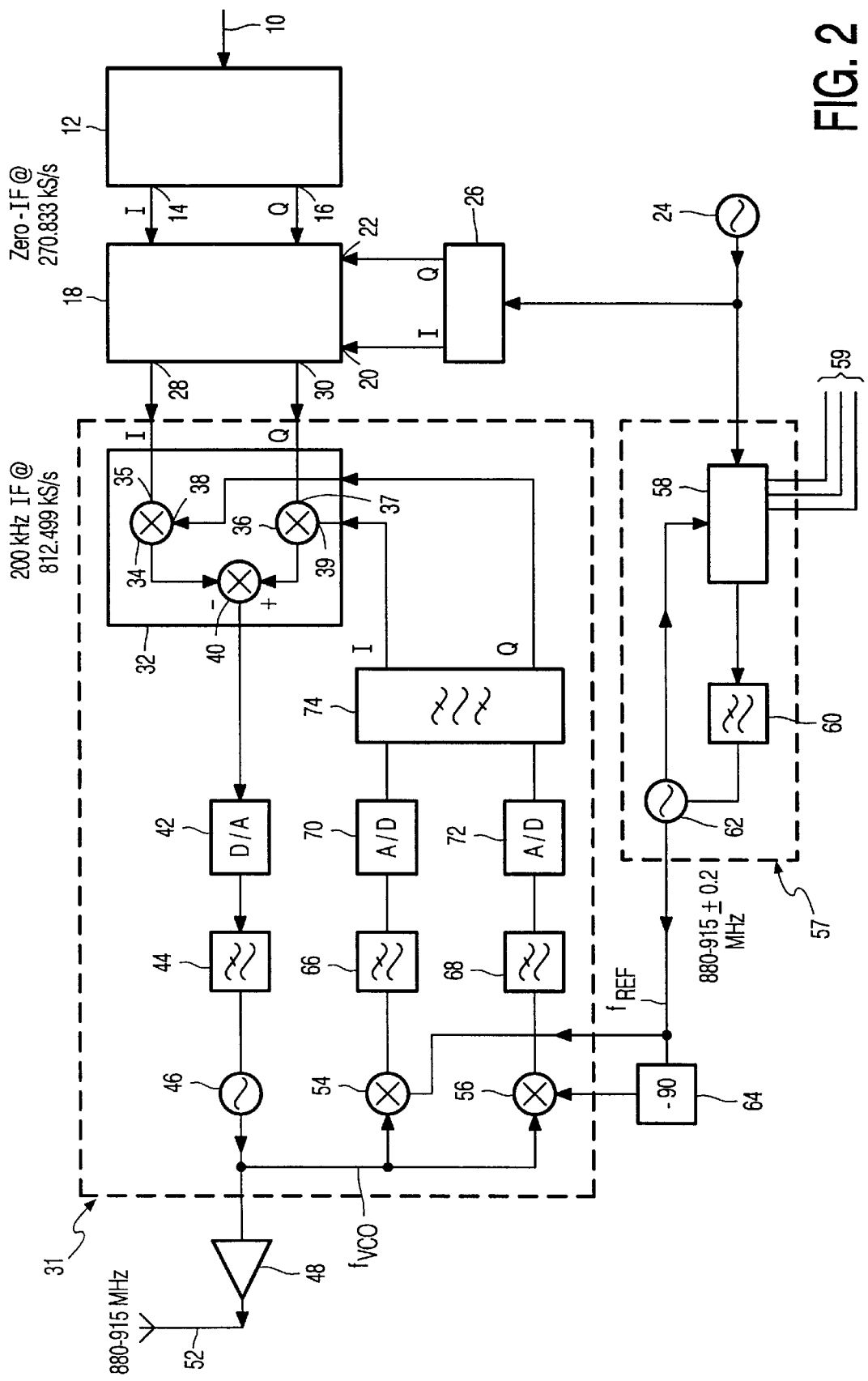
Figure 3:
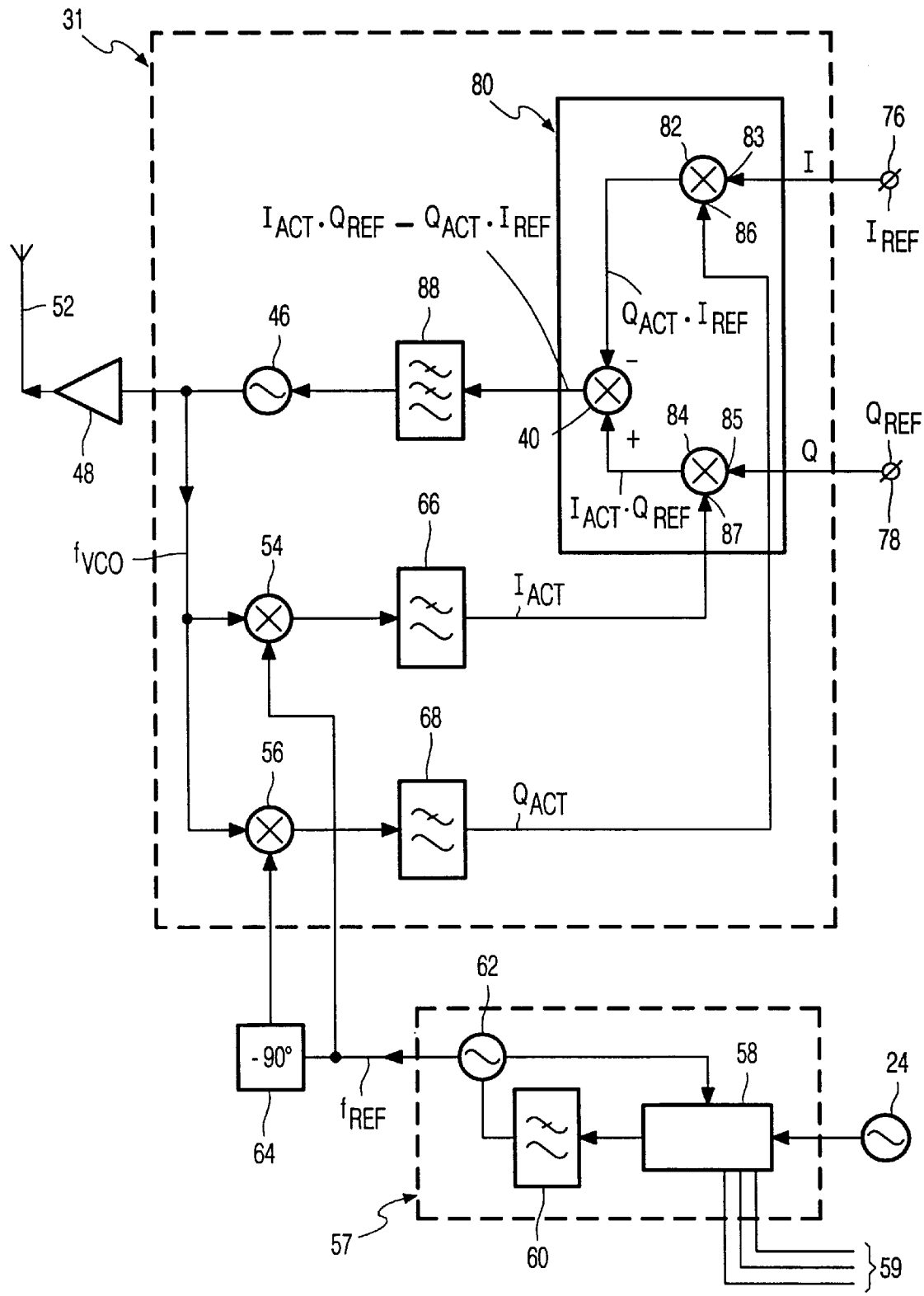

The present invention will now be described, by way of example, with reference to the accompanying drawings, wherein:

FIG. 1 is a graph showing the specification of levels of spurious emissions for a mobile station transmitter operating in accordance with the GSM standard, FIG. 2 is a block schematic diagram illustrating the architecture of one embodiment of a transmitter made in accordance with the present invention, and FIG. 3 is a block schematic diagram illustrating the architecture of a second embodiment of a transmitter made in accordance with the present invention.

In the drawings the same reference numerals have been used to indicate corresponding features.

As FIG. 1 has been described in the preamble of this specification, it will not be repeated.

The transmitter architecture shown in FIG. 2 comprises a data input 10 for data at base band. For convenience of description it will be assumed that the data is at the GSM bit rate of 270.833 kB/s. The data bits are used to modulate a zero—IF carrier using a suitable digital phase modulator such as a GMSK (Gaussian Minimum Shift Keying) modulator 12. The modulator 12 produces quadrature related complex signals I and Q on respective outputs 14, 16. More particularly, the modulator 12 is a digital element producing complex digital I and Q outputs with a 15 bit resolution at a sampling rate equal to an appropriate multiple of the bit rate. The I and Q outputs in the present example are at 270.833 kS/s (kilosamples per second). The digital outputs on the respective outputs 14, 16 are subjected to a near perfect, complex frequency translation to a predetermined low IF of 200 kHz in a digital up-converter and filtering functional block 18. The functional block 18 provides all the necessary filtering to eliminate out-of-band noise and spuriae. The complex I and Q 200 kHz translation signals on inputs 20, 22 are derived from a 13 MHz reference oscillator 24 using a digital frequency dividing stage 26. The quadrature related output signals on the outputs 28, 30 of the functional block 18 will typically have an IF of 200 kHz and a sample rate of 812.499 kS/s which is three times the bit rate. These output signals are applied to a complex phase locked loop 31 in which they undergo a complex phase comparison using signals which are derived in part from the transmitter output.

The complex phase lock loop includes a digital phase comparator 32 in which the signals on the outputs 28, 30 undergo a complex phase comparison. The comparator 32 comprises first and second multipliers 34, 36 having first inputs 35, 37, respectively, coupled to the outputs 28, 30 of the functional block 18 and second inputs 38, 39 for quadrature related signals at 200 kHz derived, as will be described later, from an output of a transmitter master oscillator 46, which master oscillator is a high quality, high power, voltage controlled oscillator (VCO). The output noise density of the master oscillator 46 at 20 MHz offset is good enough to meet the GSM specification without using external filters.

The difference signals from the multipliers 34, 36 are combined in a summing stage 40 which functions as a subtracter to form an "error" signal which represents the difference between the instantaneous phase deviation of the VCO 46 and that of the demand imposed by the modulation and the frequency demand. A digitised output of the summing stage 40 is converted into an analogue signal in a digital-to-analogue converter 42. The analogue signal is filtered in a low pass filter 44 before being applied to the transmitter VCO 46. A power amplifier 48 is coupled to an output of the transmitter VCO 46 and the output from the power amplifier is applied to an antenna 52 which propagates the signal.

The output from the transmitter VCO 46 is applied to first inputs of mixers 54, 56. A local oscillator signal is applied in quadrature to second inputs of these mixers.

The local oscillator signal is obtained from a voltage controlled local oscillator 62 which is coupled in a secondary phase locked loop 57 comprising a frequency synthesiser 58 and a low pass filter 60 coupled between the synthesiser 58 and the local oscillator 62. A control bus 59 is connected to the frequency synthesiser 58. The frequency of the local oscillator signal lies in the transmitter band of 880 to 915±0.2 MHz. The local oscillator signal is applied directly to the second input of the mixer 54 and by way of a 90 degree phase shifter 64 to the second input of the mixer 56. The products of mixing are applied to respective low pass filters 66, 68 which select the difference components. These are digitised in analogue to digital converters 70, 72. The digital signals at 200 kHz are applied to a simple digital complex bandpass filter 74 which produces I and Q signals at the correct frequency. The Q signal is applied to the second input 38 of the multiplier 34 in which it is multiplied with the I output of the block 18 and the I signal is applied to the second input 39 of the multiplier 36 in which it is multiplied with the Q output of the block 18.

As a consequence of the low IF and the effective bandwidth of the modulation, it is necessary to generate the IF signals as a complex pair and perform a complex phase comparison for the transmit loop. In the case of GSM, most of the energy of the modulation is contained within a bandwidth of ±80 kHz (i.e. 160 kHz) but there is still significant energy present at offset frequencies beyond 200 kHz. If the transmitter output were to be mixed down to an IF of 200 kHz or less using a simple, real mixing process then the modulation energy extending beyond 200 kHz would be at a negative frequency and as such would be indistinguishable from the positive frequency components. The resulting spectral folding would cause serious distortion of the modulation. By mixing the output of the transmitter VCO 46 down to 200 kHz as a complex signal overcomes the problem.

The need for complex mixing and phase comparison in the complex phase locked loop 31, that is, the loop including the transmitter VCO 46 and the mixers 54, 56, increases with decreasing IF as more of the modulation energy occupies the negative frequency region. At a zero—IF for example it would be absolutely essential. Although a zero—IF solution would undoubtedly result in the lowest possible power consumption, a serious problem would be the potential pulling effects between the transmitter VCO output and the local oscillator VCO 62 used for the mixing. With a zero—IF, both VCOs would have the same frequency, which is generally regarded as the worst possible scenario for minimising pulling effects. An IF of 100 kHz would be better but 200 kHz is the same as the channel spacing for GSM and reduces the number of steps required in the transmit synthesiser. Any higher IF would result in excessive power consumption even though it might avoid the need for complex filtering and signal processing.

It is for the same reasons that the phase comparator 32 must perform a complex multiplication of the modulated IF and the down-converted output of the transmit VCO. If the modulated IF signal after digital up-conversion is represented by $v_m$ and the down-converted output of the transmitter represented by $v_t$ then the action of the phase comparator is:

$$v_e = v_m / v_t \quad (1)$$

where $v_e$ is the error output signal for controlling the VCO. Expanding as exponentials this becomes:

$$v_e = V_m e^{-j\omega_m t} \cdot V_t e^{(j\omega_m t - 100)} = V_e e^{-j\phi} \quad (2)$$

where $\omega_m$ is the instantaneous IF, $\phi$ is the phase error in the loop and $V_m$, $V_t$ and $V_e$ are the magnitudes of the three respective signals. Taking the imaginary component of (2) for the output of the phase comparator we obtain:

$$v_e = V_e \sin(-\phi) \quad (3)$$

Mixing down the transmitter VCO 46 output to 200 kHz is accomplished to with a pair of analogue mixers 54, 56 whose local oscillator inputs are derived from local oscillator VCO 62 in phase quadrature. The I and Q outputs are filtered in a pair of low selectivity analogue, on-chip filters 66, 68 and converted to digital form in a pair of low-resolution analogue-to-digital converters 70, 72. Their outputs are filtered using a simple, digital complex filter 74 before being fed to the digital phase comparator 32. The remainder of the complex phase locked loop 31 comprises the digital-to-analogue converter 42 and the low pass filter 44 producing the analogue control signal for the transmitter VCO 46.

The embodiment illustrated in FIG. 2 assumes that there are no imperfections, that is, perfect amplitude balance and precisely 90 degrees phase shift between the I and Q signals on the outputs 28, 30 of the function block 18 and from the bandpass filter 74. If, in practice, imperfections do exist then an unwanted image will appear at the transmitter output with an offset frequency of 400 kHz (twice the IF of 200 kHz). To ensure that the image falls outside the bandwidth of the loop, an IF of the order of 800 kHz or greater would be desirable.

The transmitter architecture illustrated in FIG. 2 is substantially digital, giving the benefits of a more accurate design process (i.e. right first time), more flexibility in terms of addressing other digital transmitter standards besides GSM and increased potential for realisation in CMOS technology with its commensurate low cost of manufacture.

The embodiment of the transmitter shown in FIG. 3 comprises an analogue transmitter. Modulated zero—IF data $I_{REF}$ and $Q_{REF}$ on inputs 76, 78, respectively are applied to a complex phase locked loop 31. The loop 31 comprises an analogue phase comparator 80 including first and second multipliers 82, 84 having first inputs 83, 85, respectively, coupled to reference I/Q signals $I_{REF}$ and $Q_{REF}$ and second inputs 86, 87 for quadrature related zero—IF signals $Q_{ACT}$ and $I_{ACT}$ respectively, which, as will be described later, are derived from an output of a transmitter oscillator 46, which oscillator is a high quality, high power, voltage controlled oscillator (VCO).

The difference signals in the products of multiplication from the multipliers 82, 84 are combined in a summing stage 40 which functions as a subtracter to form an "error" signal $I_{ACT} \cdot Q_{REF} - I_{REF} \cdot Q_{ACT}$ which includes the modulated data signals. The error signal is filtered in an integrating loop filter 88 before being applied to the transmitter VCO 46. A power amplifier 48 is coupled to an output of the transmitter VCO 46 and the output from the power amplifier is applied to an antenna 52 which propagates the signal.

The output from the transmitter VCO is applied to first inputs of quadrature related mixers 54, 56. A local oscillator signal is applied in quadrature to second inputs of these mixers.

The local oscillator signal is obtained from a voltage controlled local oscillator 62 which is coupled in a secondary phase locked loop comprising a frequency synthesiser 58 and a low pass filter 60 coupled between the synthesiser 58 and the VCO 62. A control bus 59 is connected to the frequency synthesiser 58. The frequency of the local oscillator signal lies in the transmitter band of 880 to 915 MHz and is selected to generate the wanted output frequencies of the transmitter VCO 46. The local oscillator signal is applied directly to the second input of the mixer 54 and by way of a 90 degree phase shifter 64 to the second input of the mixer 56. The products of mixing are applied to respective low pass filters 66, 68 which select the difference components $I_{ACT}$ and $Q_{ACT}$ which are nominally at a zero—IF. These difference components are applied respectively to the second input 87 of the multiplier 84 in which it is multiplied with the Q output of the block 18 and the second input 86 of the multiplier 82 in which it is multiplied with the I output of the block 18.

An expansion of the exponential representation given previously for a low—IF will now be given for a zero—IF. In operation the VCO 46 frequency $f_{VCO}$ is mixed down with the frequency $f_{REF}$ in the mixers 54, 56. The result is the phase difference between $f_{VCO}$ and $f_{REF}$ in I/Q representation:

$$b = I_{ACT} + j\, Q_{ACT} = \cos\phi_{ACT} + j\sin\phi_{ACT} \qquad (1)$$

This value is to be phase compared with the reference I/Q values $I_{REF}, Q_{REF}$:

$$a = I_{REF} + j\, Q_{REF} = \cos\phi_{REF} + j\sin\phi_{REF} \qquad (2)$$

The phase difference between the actual and the reference quadrature related signals can be calculated by a complex division of the two signals. Since the amplitude of both signals should be constant because we only consider phase and frequency modulation with constant amplitude, the magnitude of both I/Q signals and the result is set to 1:

$$|a| = |b| = \frac{|a|}{|b|} = 1 \qquad (3)$$

$$\frac{a}{b} = e^{j(\phi_{REF}-\phi_{ACT})} = \cos(\phi_{REF}-\phi_{ACT}) + j\sin(\phi_{REF}-\phi_{ACT}) \qquad (4)$$

Equation (4) can be rewritten as:

$$\frac{a}{b} = \cos\phi_{REF}\cdot\cos\phi_{ACT} + \sin\phi_{REF}\cdot\sin\phi_{ACT} + j(\sin\phi_{REF}\cdot\cos\phi_{ACT} - \cos\phi_{REF}\cdot\sin\phi_{ACT}) \qquad (5)$$

In the representation of the I and Q components, equation (5) can be rewritten using the relations from equations (1) and (2) as:

$$\frac{a}{b} = I_{REF}\cdot I_{ACT} + Q_{REF}\cdot Q_{ACT} + j(Q_{REF}\cdot I_{ACT} - I_{REF}\cdot Q_{ACT}) \qquad (6)$$

Comparing the coefficients of equation (4) and equation (6) the result consists of two equations $$\cos(\phi_{REF}-\phi_{ACT}) = I_{REF}\cdot I_{ACT} + Q_{REF}\cdot Q_{ACT} \qquad (7)$$

$$\sin(\phi_{REF}-\phi_{ACT}) = Q_{REF}\cdot I_{ACT} - I_{REF}\cdot Q_{ACT} \qquad (8)$$

These equations show the I and the Q components of the phase difference between the actual and the reference I/Q signals. The I component of the difference is for small phase differences always nearly one and therefore does not contain useful information. The Q component carries the information that is wanted.

For small angles of $\phi_{REF}-\phi_{ACT}$ the equation $$\sin(\phi_{REF}-\phi_{ACT}) = \phi_{REF}-\phi_{ACT} \qquad (9)$$

is valid.

Therefore the equation giving the phase difference from the I/Q values is:

$$\phi_{REF}-\phi_{ACT} = Q_{REF}\cdot I_{ACT} - I_{REF}\cdot Q_{ACT} \qquad (10)$$

This means that the $Q_{REF}$ component should be multiplied with the $I_{ACT}$ component in an analog four quadrant multiplier. The same has to be done with the $I_{REF}$ and the $Q_{ACT}$ component. The difference of both products is for small phase angles proportional to the phase difference between the reference I/Q signals and the actual I/Q signals. Therefore this circuit works as an analog phase discriminator using I/Q signals. Since these signals are phase continuous the loop filter 88 can have a relatively wide bandwidth which enables this analog phase locked loop to react quickly.

If the output signal of the phase comparator 80 is integrated and used as the VCO tuning voltage the VCO frequency will be tuned to the value of the demand frequency modulated with the reference I/Q signals. Therefore this technique can be used to produce a modulated signal from a demand frequency and baseband I/Q signals. The major advantage is that the wideband noise can be very low, because the VCO signal is directly modulated with a low pass filtered voltage. Due to this the wideband noise voltage is no greater than the wideband noise of the VCO.

Sometimes the generation of a demand frequency $f_{REF}$ on the transmit centre frequency may be a problem for the reasons stated in the preamble. Therefore the following solutions can be used.

1. Using harmonic mixing for the down-conversion of the VCO output signal $f_{VCO}$. This means that the reference frequency is not the centre frequency of the transmitted signal, but the harmonic of the reference frequency is the centre frequency of the transmitter.
2. Using a VCO on a fraction of the transmit centre frequency which is then multiplied in a special circuit and used as the reference frequency.
3. Mixing two frequencies to produce $f_{REF}$.
4. Using a low IF phase comparison.

From reading the present disclosure, other modifications will be apparent to persons skilled in the art. Such modifications may involve other features which are already known in the design, manufacture and use of a transmitter and component parts thereof and which may be used instead of or in addition to features already described herein.

What is claimed is:

1. A transmitter comprising an oscillator for generating an output RF signal;
   applying means for applying a modulating signal, a phase error signal and a frequency demand signal to the oscillator;
   quadrature related frequency down conversion means which is coupled to the oscillator and receives quadrature related versions of a reference signal to form a down-converted signal; and
   complex phase comparison means for comparing an in-phase component of the modulating signal with a quadrature phase component of the down-converted signal, and for comparing a quadrature phase component of the modulating signal with an in-phase component of the down converted signal.

2. A transmitter as claimed in claim 1, wherein said complex phase comparison means provides the phase error signal.

3. A transmitter as claimed in claim 1, wherein said applying means is adapted to provide an analogue signal representative of the modulating signal, the phase error signal and the frequency demand signal.

4. A transmitter as claimed in 1, wherein said modulating signal includes zero IF quadrature modulated signals.

5. A transmitter as claimed in claim 4, further comprising means for frequency up-converting the zero IF quadrature modulated signals to a low IF to produce complex digitised quadrature related modulated IF signals, wherein the quadrature related frequency down conversion means includes means for producing digitised versions of the in-phase and quadrature phase components of the down converted signal at a low IF, and wherein said complex phase comparison means comprises means for comparing digital versions of the down converted signal with the complex digitised quadrature related modulated IF signals.

6. A transmitter as claimed in claim 4, wherein the phase error signal is derived using a secondary frequency synthesiser having a local oscillator which derives a reference frequency from a reference oscillator that up-converts said zero IF quadrature modulated signals.

7. A transmitter as claimed in claim 1, wherein the modulating signal is at zero IF.

8. A transmitter as claimed in claim 1, wherein the complex phase comparison means comprises an analogue phase comparator.

9. A transmitter as claimed in claim 1, wherein said quadrature related frequency down conversion means comprises harmonic mixing means for forming the down-converted signal.

* * * * *